US012253472B2

(12) United States Patent
Good et al.

(10) Patent No.: US 12,253,472 B2
(45) Date of Patent: Mar. 18, 2025

(54) SYSTEM AND METHOD FOR DETECTING A DEFECT IN A SPECIMEN

(71) Applicant: GlobalFoundries U.S. Inc., Malta, NY (US)

(72) Inventors: Richard Paul Good, Saratoga Springs, NY (US); Roberto Schiwon, Dresden (DE); Matthias Ruhm, Dresden (DE); Dirk Wollstein, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 253 days.

(21) Appl. No.: 18/052,960

(22) Filed: Nov. 7, 2022

(65) Prior Publication Data
US 2024/0151653 A1 May 9, 2024

(51) Int. Cl.
G01N 21/95 (2006.01)
G01B 11/30 (2006.01)
(52) U.S. Cl.
CPC ....... G01N 21/9501 (2013.01); G01B 11/306 (2013.01)
(58) Field of Classification Search
CPC .. G01B 11/24; G01B 11/306; G01N 21/9501; G03F 7/70483
See application file for complete search history.

(56) References Cited

U.S. PATENT DOCUMENTS

| 7,652,276 | B2 | 1/2010 | Hayakawa et al. |
| 8,855,402 | B2 | 10/2014 | Tomita et al. |
| 8,873,849 | B2 | 10/2014 | Iwanaga et al. |
| 11,200,661 | B2 | 12/2021 | Sasaki |
| 2013/0176558 | A1* | 7/2013 | Lin ............... G03F 9/7034 356/237.5 |

(Continued)

FOREIGN PATENT DOCUMENTS

| JP | 2002048527 A | * | 2/2002 | |
| KR | 20050106862 A | * | 11/2005 | ......... G03F 7/70533 |

OTHER PUBLICATIONS

Ted L. Taylor, Paul Shirley, David Dixon, Shoichiro Yanagi, Eri Makimura, "Product and tool control using integrated auto macro defect inspection in the photolithography cluster," Proc. SPIE 7638, Metrology, Inspection, and Process Control for Microlithography XXIV, 763821 (Apr. 15, 2010); doi: 10.1117/12.846571.

(Continued)

Primary Examiner — Peter B Kim
(74) Attorney, Agent, or Firm — David Cain

(57) ABSTRACT

The present disclosure generally relates to a system and a method for detecting a defect in a specimen. More particularly, the present disclosure relates to a lithography exposure system and a method for detecting a dispensing error in a wafer The present disclosure provides a system for detecting a defect in a specimen having a lithography exposure tool including a measurement unit and a stage, the measurement unit is configured to obtain topography data of the specimen placed on the stage by illumination of a surface of the specimen with an optical signal, and a processor configured to generate a statistical data from the topography data and produce a defect notification if the statistical data is outside of a control limit.

18 Claims, 7 Drawing Sheets

(56) References Cited

U.S. PATENT DOCUMENTS

2021/0080485 A1* 3/2021 Yamasaki .............. G01B 11/24
2021/0088453 A1* 3/2021 Smith .................. G01B 9/0203

OTHER PUBLICATIONS

Terrence Sweeney, Kevin Curran (2014) The Detection of Empty Resist Bottles or Air in the Resist Lines of a Photolithography Coating Tool, vol. 27, No. 11, pp:-, International Journal of Computer Integrated Manufacturing, ISSN: 0951-192X.

Kanjanawadee Shiraishi, "Monitoring Air Supply in Spin Coating Photolithography Process", Application Note on Advanced Materials Handling, Aug. 1, 2018, Entegris, Inc., https://www.entegris.com/en/home/resources/reference-materials/application-notes/monitoring-air-supply-in-spin-coating-photolithography-process.html.

J. Braggin, "Preventing Lithography-Induced Maverick Yield Events With A Dispense System Advanced Equipment Control Method," 2008 IEEE/SEMI Advanced Semiconductor Manufacturing Conference, 2008, pp. 31-36, doi: 10.1109/ASMC. 2008.4529002.

* cited by examiner

SYSTEM AND METHOD FOR DETECTING A DEFECT IN A SPECIMEN

FIELD OF INVENTION

The present disclosure generally relates to a system and method for detecting a defect in a specimen. More particularly, the present disclosure relates to a lithography exposure system for detecting a dispensing error in a wafer. The present disclosure also relates to a method for detecting a dispensing error in a wafer.

BACKGROUND

Semiconductor fabrication processes are among the most sophisticated and complex processes used in manufacturing. Semiconductor fabrication processes may require frequent monitoring and careful evaluation to perform efficiently. Defects may be introduced into a semiconductor device during the fabrication processes. Examples of defects may include contamination introduced to a wafer during a semiconductor fabrication process, or non-uniform deposition of a material upon another material. Such defects may adversely affect the performance of the process to an extent that overall yield of the fabrication process may be reduced below acceptable levels. Therefore, extensive monitoring and evaluation of semiconductor fabrication processes may typically be performed to ensure that the process is within design tolerance and to increase the overall yield of the process. Ideally, extensive monitoring and evaluation of the process may take place both during process development and during process control of semiconductor fabrication processes.

As the dimensions of semiconductor devices continue to shrink with advances in semiconductor materials and processes, the ability to examine microscopic features and to detect microscopic defects in a timely manner has become increasingly important to the successful fabrication of semiconductor devices. Testing time and process delays associated with measuring and/or inspecting a specimen may increase the overall cost of manufacturing and the manufacturing time for fabricating a semiconductor device. For example, process tools may often be idle while metrology and/or inspection of a specimen is performed so that the fabrication process may be evaluated before additional specimens are processed, which increases manufacturing delays. Furthermore, if processing problems causing the defects are not detected before additional wafers have been processed, wafers processed during this time may need to be scrapped and this can increase the overall cost of manufacturing.

SUMMARY

In an aspect of the present disclosure, there is provided a system for detecting a defect in a specimen having a lithography exposure tool including a measurement unit, the measurement unit is configured to obtain topography data of the specimen by illumination of a surface of the specimen with an optical signal, and a processor configured to generate a statistical data from the topography data and produce a defect notification if the statistical data is outside of a control limit.

In another aspect of the present disclosure, there is provided a system for detecting a photoresist dispensing error having a dispensing system adapted to dispense a photoresist layer on a substrate, a lithography exposure tool including a measurement unit, the measurement unit is configured to obtain topography data of the photoresist layer by illumination of a surface of the photoresist layer with an optical signal, and a processor configured to generate a statistical data from the topography data and produce a photoresist dispensing error notification if the statistical data is outside of a control limit.

In another aspect of the present disclosure, there is provided a method for detecting a defect in a specimen, the method including obtaining topography data of the specimen by illuminating of a surface of the specimen with an optical signal, generating a statistical data from the topography data, and producing a defect notification if the statistical data is outside of a control limit.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

The disclosure relates to a system and a method for detecting a defect in a specimen. The term "specimen" as used herein may generally relate to a wafer or a carrier media. The system described herein may refer to a lithography exposure system.

The term "wafer" as used herein generally refers to substrates formed of a semiconductor or non-semiconductor material. The semiconductor material can include, but is not limited to, silicon, silicon germanium, silicon carbon, other II-VI or III-V semiconductor compounds, and the like. The non-semiconductor material can include, but is not limited to, sapphire, spinel, zinc oxide (ZnO), or glass. Such substrates may be commonly found and/or processed in semiconductor fabrication facilities.

The specimen described herein may include a substrate and one or more layers of material formed upon the substrate. For example, these layers may include, but are not limited to, a resist, a photoresist, a dielectric material, and a conductive material. One or more layers formed on the wafer may be patterned. For example, a wafer may include a plurality of dies, each having repeatable pattern features. Alternatively, a wafer may also be unpatterned such as an unprocessed wafer. Formation and processing of such layers of material may ultimately result in completed devices. Many different types of devices may be formed on a wafer, and the term "wafer" as used herein is intended to encompass a wafer on which any type of semiconductor or electronic device is being fabricated.

Figure 1:
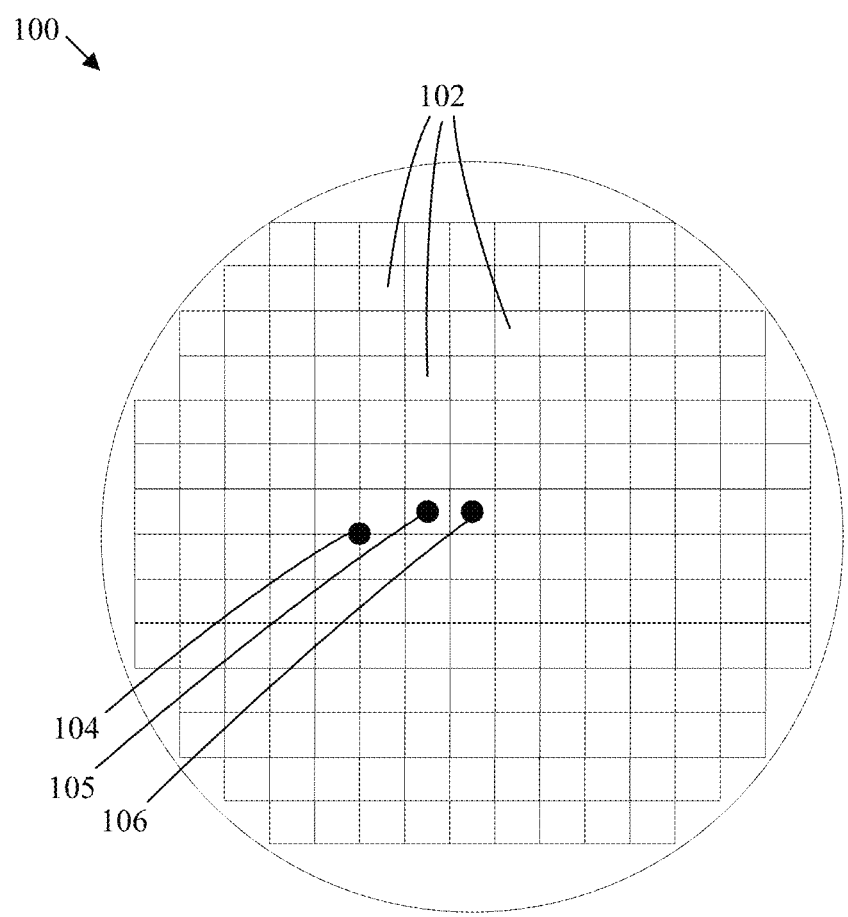
FIG. 1 is a schematic top view of an example of a specimen having a plurality of dies and defects on a surface of the specimen.

FIG. 1 illustrates an example of a specimen 100 having defects 104, 105, 106 on its surface, in which the defects is detectable by the disclosed system and method. The specimen 100 may include a plurality of dies 102. A surface of the specimen 100 may have one or more defects 104, 105, 106. The defects 104, 105, 106 may be present in any location on the surface of the specimen 100. For example, defects 105, 106 may be located within a boundary of one of the dies 102 while defect 104 may be located over boundaries of several dies 102. Examples of the defects 104, 105, 106 may include a dispensing error or a surface scratch. Examples of the dispensing error may include, but are not limited to, an incomplete coverage of a layer of material over a substrate, insufficient amount of material dispensed onto a substrate, air bubbles in the dispensed material, uneven topography of a layer of material formed over a substrate, or a contamination of a layer of material formed over a substrate. The term "dispensing error" used herein may also refer to the term "deposition error". The defects 104, 105, 106 may be caused by a malfunctioning deposition tool, a malfunctioning material dispensing system, or human error in the handling of the specimen 100. In addition, any number of each of the defects described above may also be present on the surface of the specimen.

Figure 2:
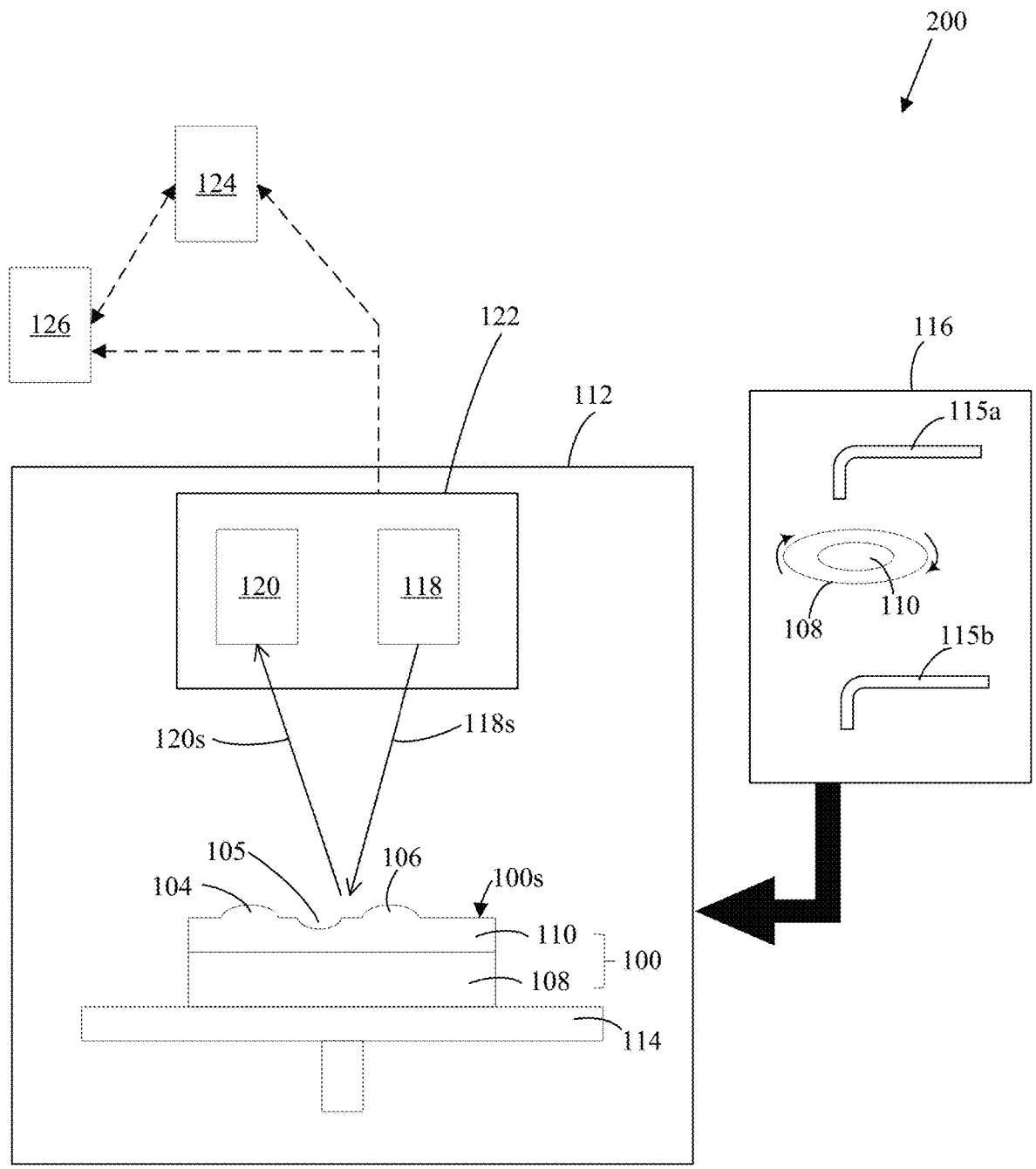
FIG. 2 is a schematic side view of an example of a system having a measurement unit, a storage medium, and a processor.

Referring to FIG. 2, an example system 200 for detecting a defect in a specimen 100 is shown. The system 200 may include a measurement unit 122, a processor 126, and a storage medium 124. The system 200 may also include a lithography exposure tool 112, in which the lithography exposure tool 112 may include the measurement unit 122 and a stage 114. The specimen 100 may be placed on the stage 114. As used herein, the term "stage" refers to a support device such as a pedestal, a spin coater, a bake plate, a chill plate, an exposure stage, a motorized chuck, a vacuum chuck, or an electrostatic chuck. Examples of the lithography exposure tool 112 may include a scanner, a stepper, or any system or tool for creating patterns by lithographic methods. In some implementations, the lithography exposure tool 112 may include a process chamber (not shown) which houses at least the stage 114 and the specimen 100. Some examples of the process chamber may include, but are not limited to, an etch chamber, a resist apply chamber, or a deposition chamber.

The specimen 100 may have a surface 100s. In some examples, the specimen 100 may include a layer of material 110 formed on a substrate 108. The layer of material 110 may be formed on the substrate 108 using deposition or spin coating processes. The surface 100s of the specimen 100 may refer to the surface 100s of the layer of material 110 formed on the substrate 108. As used herein, the term "deposition" may refer to a process of applying a material over another material (or the substrate). In the example shown in FIG. 2, the system 200 may also include a dispensing system 116, such as a lithography track system. The dispensing system 116 may be adapted to dispense the layer of material 110 onto the substrate 108. In an implementation, the dispensing system 116 may include one or more nozzles 115a, 115b for dispensing material using a spin coating process. After the dispensing of the layer of material 110 onto the substrate 108, the substrate 108 may be moved from the dispensing system 116 to the lithography exposure tool 112 and may be placed on the stage 114. Ideally, the layer of material 110 may be evenly formed on the substrate 108 such that the specimen 100 has a substantially flat or substantially smooth surface 100s. However, in practice, defects 104, 105, 106 may be found on the surface 100s of the specimen 100. In the example shown in FIG. 2, the layer of material 110 may not be evenly formed on the substrate 108 and the defects 104, 105, 106 may cause an uneven topography of the layer of material 110 formed on the substrate 108. The defects 104, 105, 106 may appear as convex surface regions 104, 106 such as bumps on the surface 100s of the specimen, or concave surface regions 105 such as dimples or recesses in the surface 100s of the specimen 100.

In another example shown in FIG. 2, the layer of material 110 may be a photoresist layer 110. The photoresist layer 110 may be dispensed onto the substrate 108 using the dispensing system 116. Ideally, the photoresist layer 110 dispensed onto the substrate 108 may have an even topography so that the photoresist layer 110 may have a substantially smooth or flat surface 100s. A dispensing error, such as a photoresist dispensing error, may occur where the photoresist layer 110 dispensed from the dispensing system 116 may contain air bubbles. The air bubbles may be trapped in the photoresist layer 110 causing raised bumps or convex surface regions 104, 106 resulting in an uneven topography of the photoresist layer 110 on the substrate 108, and the photoresist layer 110 may not have a substantially smooth or flat surface 100s. Another photoresist dispensing error may occur where the amount of photoresist layer 110 dispensed from the dispensing system 116 is insufficient resulting in a thickness of the dispensed photoresist layer 110 on the substrate 108 being smaller than a desired thickness of the dispensed photoresist layer 110 on the substrate 108. Another photoresist dispensing error may occur where the amount of photoresist layer 110 dispensed from the dispensing system 116 is uneven across the surface area of the substrate 108. The uneven dispensing may cause dimples, recesses, or concave surface regions 105 as well as raised bumps or convex surface regions 104, 106 resulting in an uneven topography of the photoresist layer 110 on the substrate 108, and the photoresist layer 110 may not have a substantially smooth or flat surface 100s. In some instances, the uneven dispensing may cause incomplete coverage of the photoresist layer 110 over the substrate 108 (i.e., the dispensed photoresist layer 110 does not cover certain portions of the surface area of the substrate 108). Another photoresist dispensing error may occur where a material different from the photoresist layer 110 (e.g., a dielectric material such as an oxide or a nitride) is inadvertently dispensed onto the photoresist layer 110 causing contaminated regions to occur in the photoresist layer 110. For example, nozzle 115a may dispense the photoresist layer 110 onto the substrate 108, while nozzle 115b may inadvertently dispense an oxide layer onto the photoresist layer 110, creating a contaminated region. The contaminated regions in the photoresist layer 110 may appear as bumps raised above the photoresist layer 110.

The measurement unit 122 may be configured to obtain topography data of the specimen 100 by illumination of the surface 100s of the specimen 100 with an optical signal. In some examples, the measurement unit 122 may be configured to obtain topography data of the specimen 100 by illumination of the surface 100s of the photoresist layer 110 with an optical signal. As used herein, the term "illumination" may also include irradiation, projection, shining, or direction of an electromagnetic wave onto a body or object. Examples of the measurement unit 122 may include, but are not limited to, a metrology device, an inspection device, or a combination metrology and inspection device. The measurement unit 122 may include an illumination system 118 and a detection system 120. The illumination system 118 may be configured to direct an optical signal 118s towards the surface 100s of the specimen 100 placed on the stage 114. Examples of the optical signal 118s from the illumination system 118 may include ultraviolet light, visible light, infra-red light, X-rays, gamma rays, microwaves, or radio-frequencies. In addition, the optical signal 118s may be emitted from the illumination system 118 in the form of an energized beam, such as a laser beam.

The detection system 120 may be coupled to the illumination system 118 and may be configured to detect an optical signal 120s propagating or reflected from the surface 100s of the specimen 100. The topography data of the specimen 100 may be obtained from the optical signal 120s detected by the detection system 120. The detection system 120 may include light sensors, such as a photodetector, an interferometer, photodiodes, a spectrophotometer, a position sensitive detector, photomultiplier tubes, avalanche photodiodes, a charge-coupled device (CCD) camera, a time delay integration (TDI) camera, a video camera, a pattern recognition device, and an imaging system. In addition, the detection system 120 may include solid state detectors such as Schottky solid state barrier detectors.

The topography data of the specimen 100 may include leveling data of the specimen 100. The topography data of the specimen 100 may correspond to a mapped image containing surface height information of the specimen 100. For example, the specimen 100 may be positioned under the measurement unit 122 which maps the surface 100s of the specimen 100 to obtain the topography data through the direction of the optical signal 118s toward the surface 100s by the illumination system 118 and the detection of the optical signal 120s from the surface 100s by the detection system 120. The specimen 100 may have an array of exposure areas (e.g., dies on a wafer). The illumination system 118 may direct a beam of light on the exposure areas in succession, one at a time. Using the reflected light from the exposure areas, the detection system 120 may measure the height of the surface 100s relative to a physical reference surface of the stage 114 at each exposure area of the surface 100s of the specimen 100 and generate a map of the specimen 100 containing the surface height information of each of the exposure area of the specimen 100. This surface height information may be presented in the form of an image signature. The detection system 120 may also obtain data corresponding to an image signature of the stage 114. This data may be referred to as a "stage signature".

The storage medium 124 may be coupled to the measurement unit 122 and the processor 126. The storage medium 124 may be configured to store the topography data of the specimen 100. Examples of the storage medium 124 may include, but are not limited to, a hard drive, a read-only memory, a random-access memory, a magnetic or optical disk, or a magnetic tape. The storage medium may include other types of memory devices as well, or combinations thereof.

The storage medium 124 may also be configured to store a reference topography data. The reference topography data may be a statistical mean obtained from topography data of a plurality of reference specimens, or alternatively, may be a topography data of a single reference specimen. The term "reference specimen" as used herein may refer to a specimen having no defects. The reference specimen may, for example, have a layer of material that is evenly formed on the substrate and may have a substantially flat surface profile. In some instances, the surface of the reference specimen may be concave or slightly concave with a substantially smooth surface profile (i.e., having no bumps, or dimples). Accordingly, the reference topography data may contain leveling data of the reference specimen(s) and may correspond to a mapped image containing surface height information of the reference specimen(s). The reference topography data may be stored in the storage medium 124, for example, by a user input, or alternatively, by scanning the reference specimen(s) and then storing the scanned topography data in the storage medium 124.

The processor 126 may be coupled to the measurement unit 122 and the storage medium 124. The processor 126 may receive the topography data of the specimen 100 and the reference topography data. The processor 126 may be configured to generate a statistical data from the topography data of the specimen 100 and produce a defect notification if the statistical data is outside of a control limit. The generation of the statistical data from the topography data of the specimen 100 may include subtracting the topography data of the specimen 100 from the reference topography data to obtain a residual data, processing the residual data using a high-pass filter to obtain a filtered data, and performing a statistical analysis on the filtered data to obtain the statistical data. The statistical analysis may include summary statistics or descriptive statistics. The statistical data may be a root mean square error, a mean square error, a percentile, median, or a mean standard deviation.

The control limit may be a data stored in the storage medium 124. The control limit may include a range of values or a single value. The value or range of values in the control limit may be entered or input by a user into the storage medium 124. The statistical data may be compared against the control limit to ascertain whether the statistical data is outside of the control limit. The control limit may be retrieved from the storage medium 124 during the comparison of the statistical data and the control limit. The control limit may be determined based on historical data or engineering judgement. An example of historical data for use as the control limit may include an acceptable standard deviation about a mean value obtained from a plurality of reference specimens.

The defect notification produced by the processor 126 may be used to terminate a semiconductor process so that the defects may be rectified. For example, the specimen 100 may be a wafer undergoing a spin coating process, in which a layer of material 110 (e.g., a photo resist layer) is spin coated on a substrate 108. After the photoresist layer 110 has been spin coated on the substrate 108, the specimen 100 may be assessed for defects using the system 200. If the specimen 100 is found to have the defects 104, 105, 106, a defect notification is produced to notify an operator. In some examples, the defect notification is a photoresist dispensing error notification. The operator may terminate the semiconductor process and rectify the defects 104, 105, 106, for example, by removing the photoresist layer 110 from the substrate 108. The wafer may subsequently be reworked, for example, by spin coating a new photoresist layer 110 on the substrate 108.

Figure 3:
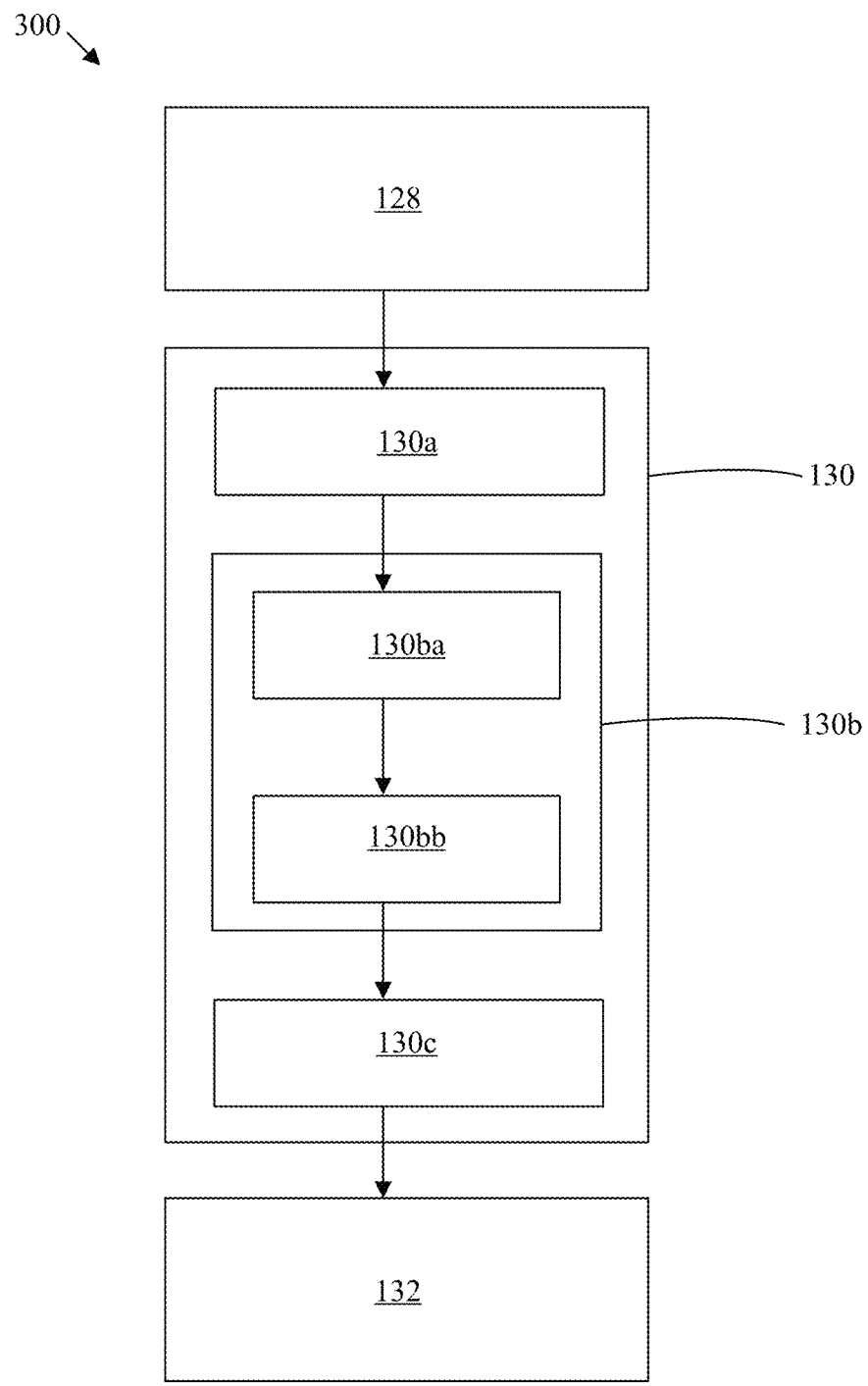
FIG. 3 is a flow chart illustrating a method for detecting a defect in a specimen.

Referring to FIG. 3, an example of a method 300 for detecting a defect in a specimen may include steps 128, 130, 132. As shown in step 128, the method may include obtaining topography data of a specimen by illuminating of a surface of the specimen with an optical signal, for example, using a lithography exposure tool. The lithography exposure tool may include a measurement unit and a stage. The measurement unit may be used to illuminate the surface of the specimen with the optical signal and the specimen may be placed on the stage. In some implementations, the obtaining of the topography data of the specimen may include directing an optical signal toward the surface of the specimen using an illumination system and detecting an optical signal propagating or reflected from the surface of the specimen using a detection system. The topography data may include leveling data of the specimen.

As shown in step 130, the method may include generating a statistical data from the topography data, for example, using a processor. Step 130 of generating of the statistical data from the topography data may include step 130a of subtracting the topography data of the specimen 100 from the reference topography data to obtain a residual data, step 130b of processing the residual data using a high-pass filter to obtain a filtered data, and step 130c of performing a statistical analysis on the filtered data to obtain the statistical data. Step 130b of processing of the residual data using the high-pass filter may include step 130ba of blurring the residual data to obtain a blurred data and step 130bb of subtracting the blurred data from the residual data to obtain the filtered data. In some implementations, the blurring of the residual data in step 130ba may be performed using a Gaussian blur. Other image processing techniques may also be used to perform the blurring of the residual data in step 130ba.

As shown in step 132, the method may include producing a defect notification if the statistical data is outside of a control limit, for example, using the processor. The defect notification may be received and displayed on a control panel. Although not shown in FIG. 3, the method 300 may also include terminating a semiconductor process upon receiving the defect notification so that the defects in the specimen may be rectified.

An example method for detecting a defect in a specimen (e.g., a wafer) shall be described with reference to FIG. 4, FIG. 5, FIG. 6, FIG. 7, FIG. 8A, FIG. 8B, and FIG. 9. Various computer software, such as Python, pandas, Matplotlib, NumPy, and SciPy, may be used in the example method.

Figure 4:
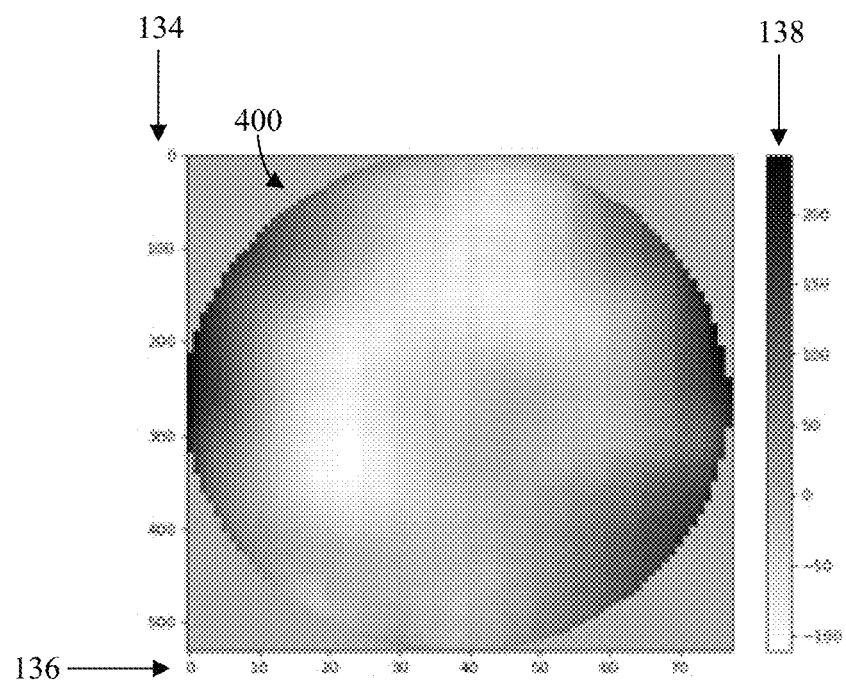
FIG. 4 is an image signature illustrating reference topography data.
Figure 5:
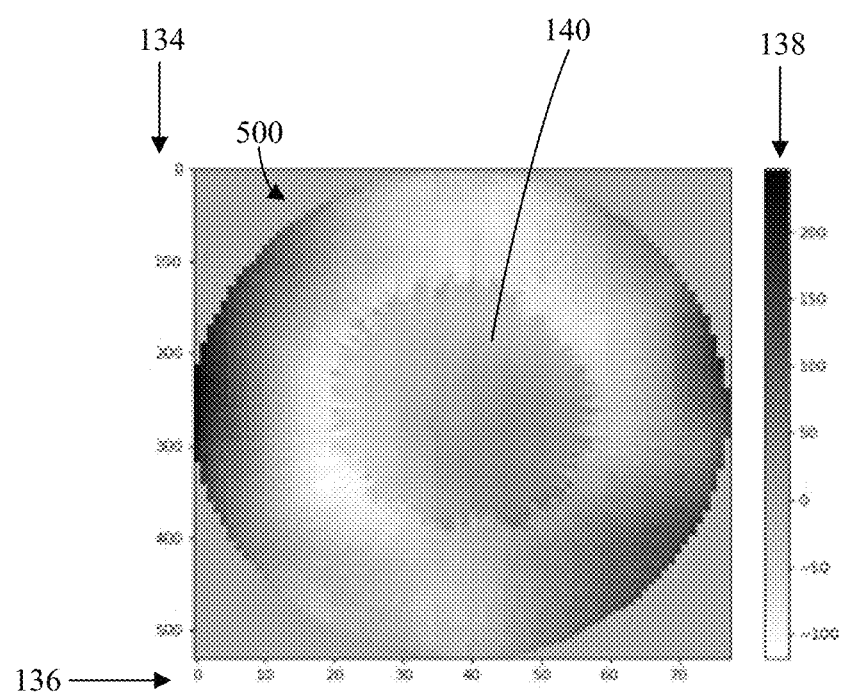
FIG. 5 is an image signature illustrating topography data of a specimen.

FIG. 4 illustrates a reference topography data 400 while FIG. 5 illustrates topography data 500 of a wafer specimen. The reference topography data 400 and the topography data 500 can be obtained from measuring respective surfaces of reference wafers and a wafer specimen. The surfaces of the wafer specimen and the reference wafers can be mapped as image signatures that are represented in a graphical form using a cartesian coordinate system. Each coordinate in the cartesian coordinate system may correspond to a pixel in the respective images. FIG. 4 and FIG. 5 depict images having a left vertical axis 134, a right vertical axis 138, and a horizontal axis 136. The left vertical axis 134 and the horizontal axis 136 represent cartesian coordinates along a plane parallel to the surface of the wafer specimen and reference wafers. The left vertical axis 134 represents locations along a first direction in the plane parallel to the surface of the wafer specimen. The horizontal axis 136 represents locations along a second direction in the plane parallel to the surface of the wafer specimen, the second direction being perpendicular to the first direction. The right vertical axis 138 represents values corresponding to the height of the surface of the wafer specimen and reference wafers relative to a physical reference surface.

A lithography exposure tool (e.g., ASML TWINSCAN NXT:1950i immersion lithography system operating at a 193 nm argon-fluoride light source) may be used to obtain the reference topography data 400 and the topography data 500. The lithography exposure tool may have a chamber and a stage (e.g., a chuck) housed in the chamber. The reference wafer and the wafer specimens may be placed on the chuck. The surfaces of the reference wafer and wafer specimens may be illuminated with a laser to measure the respective height of the surfaces of the reference wafer and wafer specimens relative to a physical reference surface of the chuck. The measurement of the height of the surfaces of the reference wafer and wafer specimens may also collect data corresponding to the signature of the chuck (i.e., chuck signature). The reference topography data 400 and the topography data 500 may be collected in a data frame using pandas computer software. As shown in FIG. 4 and FIG. 5, it is observed that the reference topography data 400 had no defects while the topography data 500 of the wafer specimen had a defect region 140.

Figure 6:
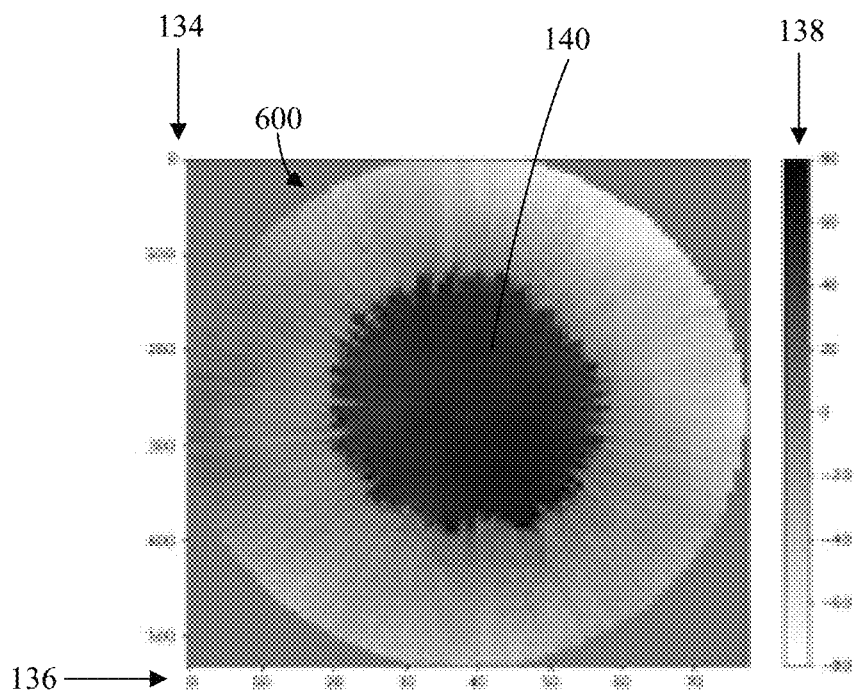
FIG. 6 is an image signature illustrating residual data obtained from the topography data of the specimen shown in FIG. 5.

FIG. 6 illustrates residual data 600 obtained from the topography data 500 shown in FIG. 5. The residual data 600 may be obtained by subtracting the topography data 500 in FIG. 5 from the reference topography data 400 in FIG. 4 (using NumPy computer software). The subtraction of the topography data 500 from the reference topography data 400 may highlight the defect region 140 in the image signature shown in FIG. 6. The subtraction of the topography data 500 from the reference topography data 400 may also remove the chuck signature from the topography data 500.

Figure 7:
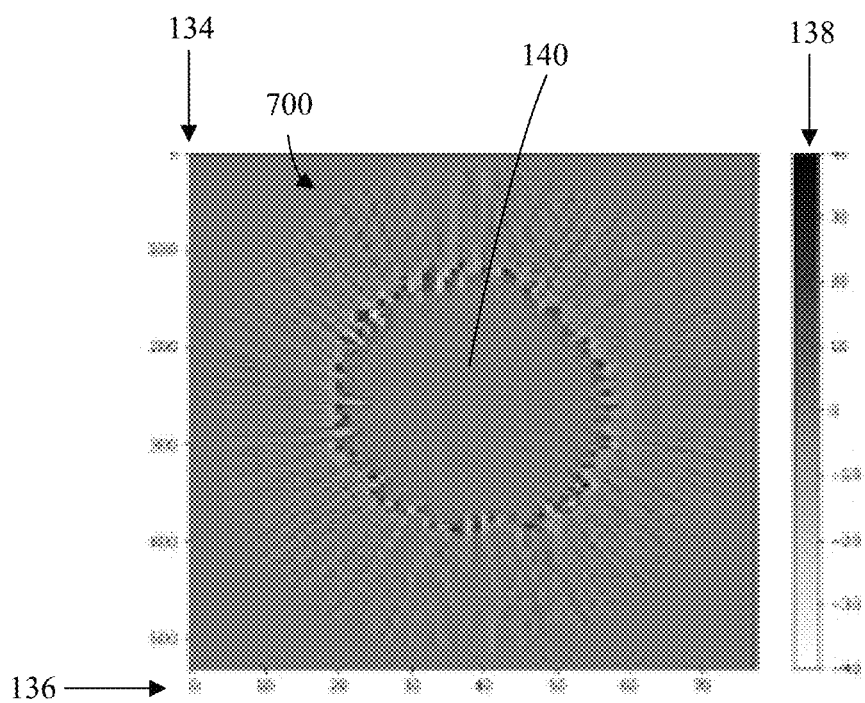
FIG. 7 is an image signature illustrating filtered data obtained from the residual data shown in FIG. 6.

FIG. 7 illustrates filtered data 700 obtained from the residual data shown in FIG. 6. The residual data 600 may be processed (e.g., filtered) using a high-pass filter to obtain the filtered data 700. The use of the high-pass filter may ensure that only high frequency signals are retained in the filtered data 700 while low frequency signals are removed. The filtering of the residual data 600 may include blurring the residual data 600 using a Gaussian blur to obtain a blurred data (using SciPy computer software), and then subtracting the blurred data from the residual data 600 to obtain the filtered data 700 (using NumPy computer software). The blurring of the residual data 600 may retain low frequency signals in the blurred data. The subtraction of the blurred data from the residual data 600 may remove the low frequency signals from the residual data 600 and thus retain high frequency signals in the filtered data 700.

Figure 8A:
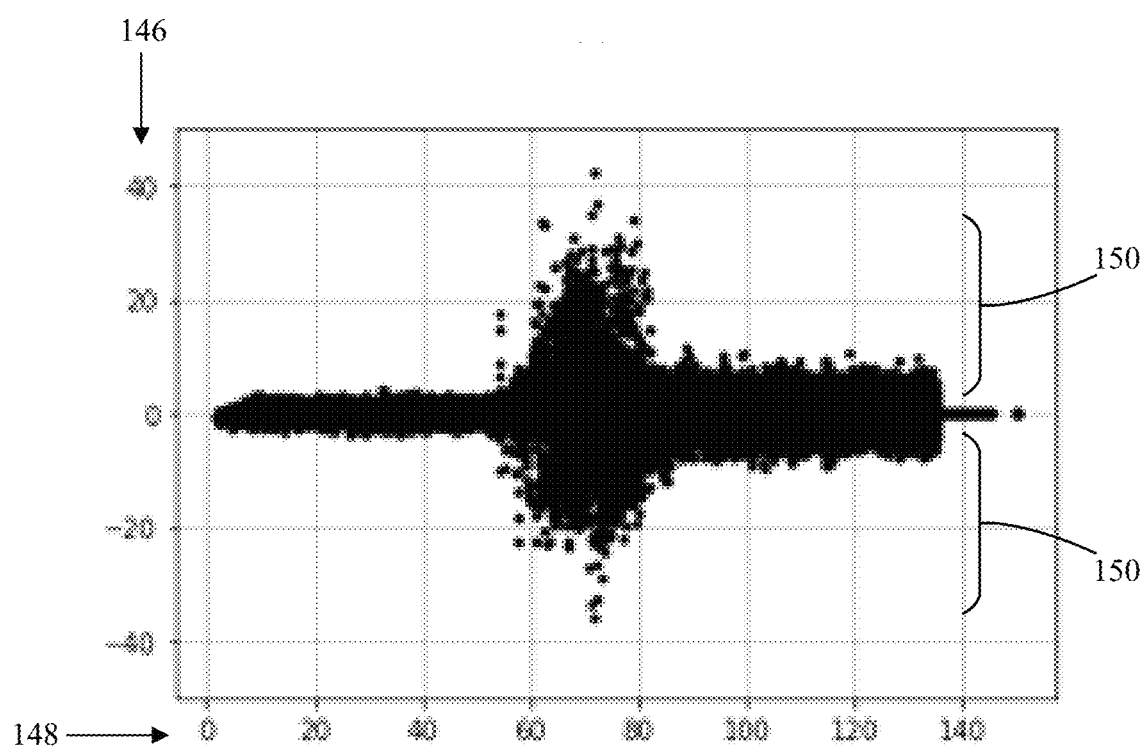
FIG. 8A is a graph illustrating statistical residuals of the filtered data shown in FIG. 7.

FIG. 8A illustrates the statistical residuals of the filtered data shown in FIG. 7. The term "statistical residual" as used herein refers to the deviation of a data point from a reference value. The filtered data 700 in FIG. 7 may be compared against a reference value to assess the deviation of the data points. As shown in FIG. 8A, the vertical axis 146 indicates the value of the filtered data (i.e., subtracted difference between blurred data and residual data) in nanometers, and the horizontal axis 148 indicates the radius of the wafer specimen in nanometers. On the vertical axis 146, the value zero is set as the reference value. Larger deviations 150 of data points from the reference value are observed in the wafer specimen at radii between 60-80, which may be an indication of defective regions in the wafer specimen.

Figure 8B:
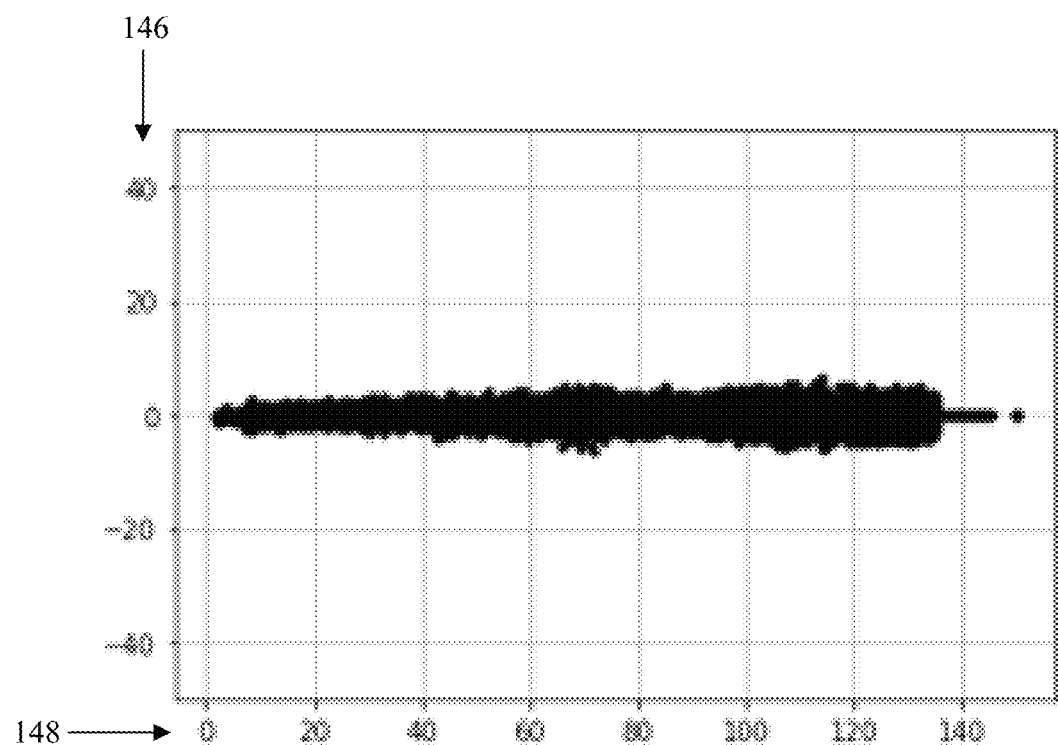
FIG. 8B is a graph illustrating the statistical residuals obtained after processing the reference topography data in FIG. 4 using the methods described in FIG. 6 and FIG. 7.

FIG. 8B illustrates the statistical residuals obtained after processing the reference topography data in FIG. 4 using the methods described in FIG. 6 and FIG. 7. Similar to FIG. 8A, in FIG. 8B, the vertical axis 146 indicates the value of the filtered data (i.e., subtracted difference between blurred data and residual data) in nanometers, and the horizontal axis 148 indicates the radius of the wafer specimen in nanometers. On the vertical axis 146, the value zero is set as the reference value. Comparing the graph in FIG. 8B with the graph in FIG. 8A, it can be observed that there are smaller deviations of data points from the reference value at all radii in a reference specimen. The graphs shown in FIG. 8A and FIG. 8B can be plotted using Matplotlib computer software.

Figure 9:
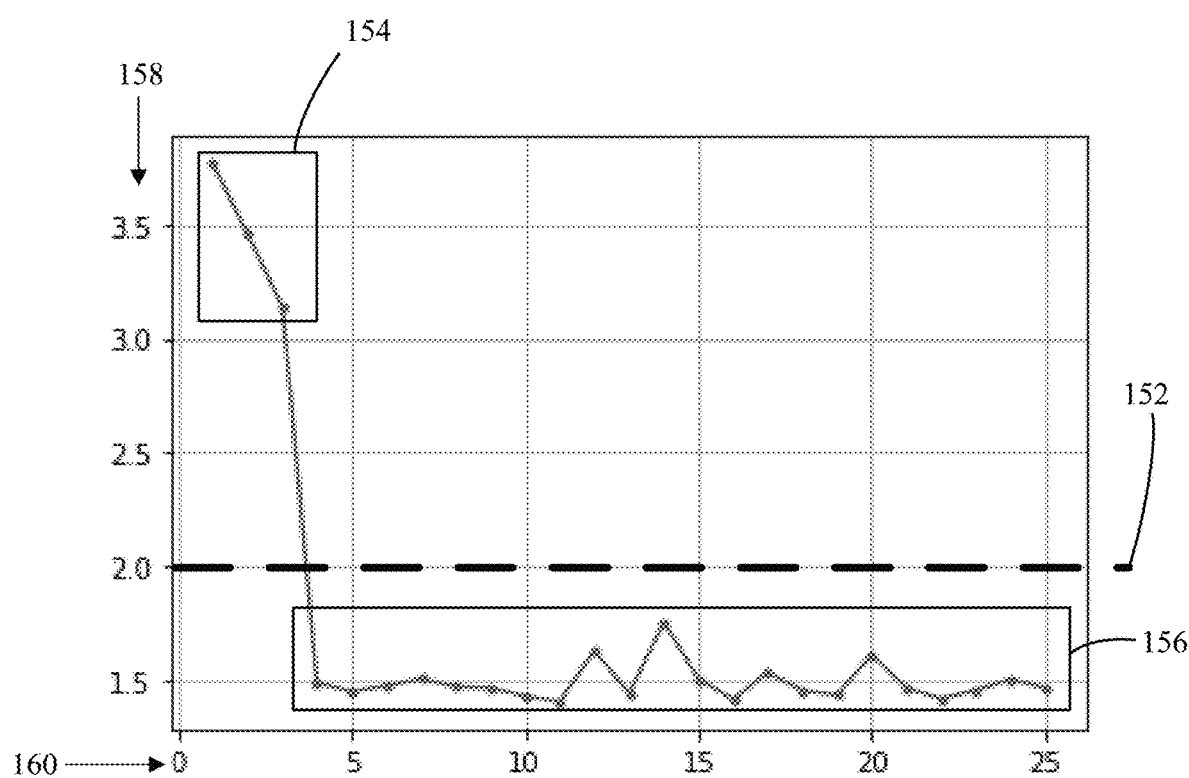
FIG. 9 is a graph illustrating the statistical data obtained from a statistical analysis of the filtered data in FIG. 7.

FIG. 9 illustrates a statistical data obtained from the filtered data 700 shown in FIG. 7 after performing a statistical analysis. A summary statistic may be performed on the filtered data 700 in FIG. 7 to obtain a root mean square error (calculated using NumPy computer software). The root mean square error obtained from the filtered data 700 may be plotted (using Matplotlib computer software) on the graph shown in FIG. 9 together with root mean square errors obtained for other wafer specimens. In FIG. 9, the vertical axis 158 indicates the root mean square error values while the horizontal axis 160 indicates the wafer specimen number. The wafer specimen number may refer to the number assigned to each wafer specimen for identification. As shown in FIG. 9, a control limit 152 may be set as a range of values between 0 to a specific value (e.g., 2) on the vertical axis 158. The root mean square error values for the wafer specimen numbers can be compared against the control limit 152. Data points 154 on the graph in FIG. 9 that are outside of the control limit 152 may be deemed as defective while data points 156 on the graph in FIG. 9 that are below the control limit 152 may be deemed as non-defective.

Throughout this disclosure, the terms "comprise", "include", "have", and any variations thereof, are intended to cover a non-exclusive inclusion, such that a process, method, article, or device that comprises a list of elements is not necessarily limited to those elements but may include other elements not expressly listed or inherent to such process, method, article, or device. Occurrences of the phrase "in an embodiment", "in an example", "in an implementation" herein do not necessarily all refer to the same embodiment, example, or implementation, respectively.

The descriptions of the various embodiments of the present disclosure have been presented for purposes of illustration but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

In addition, unless otherwise indicated, all numbers expressing quantities, ratios, and numerical properties of materials, reaction conditions, and so forth used in the specification and claims are to be understood as being modified in all instances by language of approximation, such as "about", "approximately", and "substantially", and are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present disclosure, the systems and methods disclosed herein may be employed in a variety of different semiconductor fabrication processes and stages.

What is claimed is:

1. A system for detecting a defect in a specimen comprising:
a lithography exposure tool including a measurement unit, the measurement unit is configured to obtain topography data of the specimen by illumination of a surface of the specimen with an optical signal; and
a processor configured to generate a statistical data from the topography data and produce a defect notification if the statistical data is outside of a control limit, wherein the generation of the statistical data from the topography data comprises a subtraction of the topography data of the specimen from a reference topography data to obtain a residual data, and a processing of the residual data using a high-pass filter to obtain a filtered data.

2. The system of claim 1, wherein the topography data includes leveling data of the specimen.

3. The system of claim 1, wherein the statistical data is a root mean square error.

4. The system of claim 1, wherein the defect is a photoresist dispensing error.

5. The system of claim 4, wherein the specimen includes a substrate and a photoresist layer dispensed on the substrate.

6. The system of claim 5, further comprising a dispensing system adapted to dispense the photoresist layer on the substrate.

7. The system of claim 6, further comprising a storage medium coupled to the measurement unit and the processor, the storage medium is configured to store the topography data of the specimen.

8. The system of claim 7, wherein the storage medium is also configured to store a reference topography data.

9. The system of claim 8, wherein the reference topography data is a statistical mean from topography data of a plurality of reference specimens.

10. The system of claim 8, wherein the reference topography data is a topography data of a single reference specimen.

11. The system of claim 7, wherein the measurement unit includes an illumination system configured to direct an optical signal towards the surface of the specimen and a detection system configured to detect an optical signal propagating from the surface of the specimen.

12. A system for detecting a photoresist dispensing error comprising:
- a dispensing system adapted to dispense a photoresist layer on a substrate;
- a lithography exposure tool including a measurement unit, the measurement unit is configured to obtain topography data of the photoresist layer by illumination of a surface of the photoresist layer with an optical signal; and
- a processor configured to generate a statistical data from the topography data and produce the photoresist dispensing error notification if the statistical data is outside of a control limit, wherein the generation of the statistical data from the topography data comprises a subtraction of the topography data of the specimen from a reference topography data to obtain a residual data, and a processing of the residual data using a high-pass filter to obtain a filtered data.

13. A method for detecting a defect in a specimen, the method comprising:
- obtaining topography data of the specimen by illuminating of a surface of the specimen with an optical signal;
- generating a statistical data from the topography data, wherein the generating of the statistical data from the topography data comprises subtracting the topography data of the specimen from a reference topography data to obtain a residual data, and processing the residual data using a high-pass filter to obtain a filtered data; and
- producing a defect notification if the statistical data is outside of a control limit.

14. The method of claim 13, wherein the processing of the residual data using the high-pass filter comprises:
- blurring the residual data to obtain a blurred data; and
- subtracting the blurred data from the residual data to obtain the filtered data.

15. The method of claim 13, wherein the generating of the statistical data from the topography data further comprises performing a statistical analysis on the filtered data to obtain the statistical data.

16. The method of claim 13, wherein the topography data includes leveling data of the specimen.

17. The method of claim 13, wherein the reference topography data is a statistical mean obtained from topography data of a plurality of reference specimen.

18. The method of claim 13, wherein the reference topography data is a topography data of a single reference specimen.

* * * * *